United States Patent [19]
Shin

[11] Patent Number: 6,005,819
[45] Date of Patent: Dec. 21, 1999

[54] DEMAND-ANTICIPATING POWER CONTROL CIRCUITS FOR INTEGRATED CIRCUIT DEVICES AND METHODS OF OPERATION THEREOF

[75] Inventor: Sang Woong Shin, Seoul, Rep. of Korea

[73] Assignee: Samsung Electronics Co., Ltd., Rep. of Korea

[21] Appl. No.: 09/241,835

[22] Filed: Feb. 1, 1999

[30] Foreign Application Priority Data

Feb. 10, 1998 [KR] Rep. of Korea .......................... 98-3841

[51] Int. Cl.[6] ...................................................... G11C 8/00
[52] U.S. Cl. ........................................ 365/226; 365/189.09
[58] Field of Search ................................ 365/226, 189.09

[56] References Cited

U.S. PATENT DOCUMENTS

5,568,440  10/1996  Tsukude et al. ..................... 365/189.09
5,612,920   3/1997  Tomishima ............................. 365/226

Primary Examiner—Vu A. Le
Attorney, Agent, or Firm—Myers Bigel Sibley & Sajovec

[57] ABSTRACT

A power control circuit controls a voltage supplied to a load circuit, such as a memory write driver circuit, that exhibits a current demand responsive to a load control signal applied thereto. The power control circuit includes a power supply input terminal configured to receive a supply voltage and an output terminal configured to connect to the load circuit. A voltage regulator circuit is connected between the power supply input terminal and the output terminal and operative to regulate a voltage at the output terminal. A bypass circuit is operative to couple the power supply input terminal to the output terminal responsive to the load control signal and thereby bypass the voltage regulator circuit. The bypass circuit preferably includes a bypass control circuit configured to receive the load control signal and operative to generate a bypass control signal responsive to the load control signal, and a switching circuit, e.g., a transistor, operative to couple and decouple the power supply input terminal and the output terminal responsive to the bypass control signal. Related methods are also discussed.

18 Claims, 8 Drawing Sheets

DEMAND-ANTICIPATING POWER CONTROL CIRCUITS FOR INTEGRATED CIRCUIT DEVICES AND METHODS OF OPERATION THEREOF

FIELD OF THE INVENTION

The present invention relates to integrated circuit devices and methods, and more particularly, to power control circuits and methods for integrated circuit devices.

BACKGROUND OF THE INVENTION

From the point of view of reliability and power consumption, it is desirable to operate integrated circuit memory devices using lower supply voltages. Accordingly, many memory devices employ down converters for producing reduced supply voltages from a higher voltage source. A typical down converter generates an internal supply voltage by stepping down an external supply voltage of 5 V to a lower level. Such a down converter typically also regulates the reduced supply voltage to increase immunity to variation in the external supply voltage.

Figure 1:
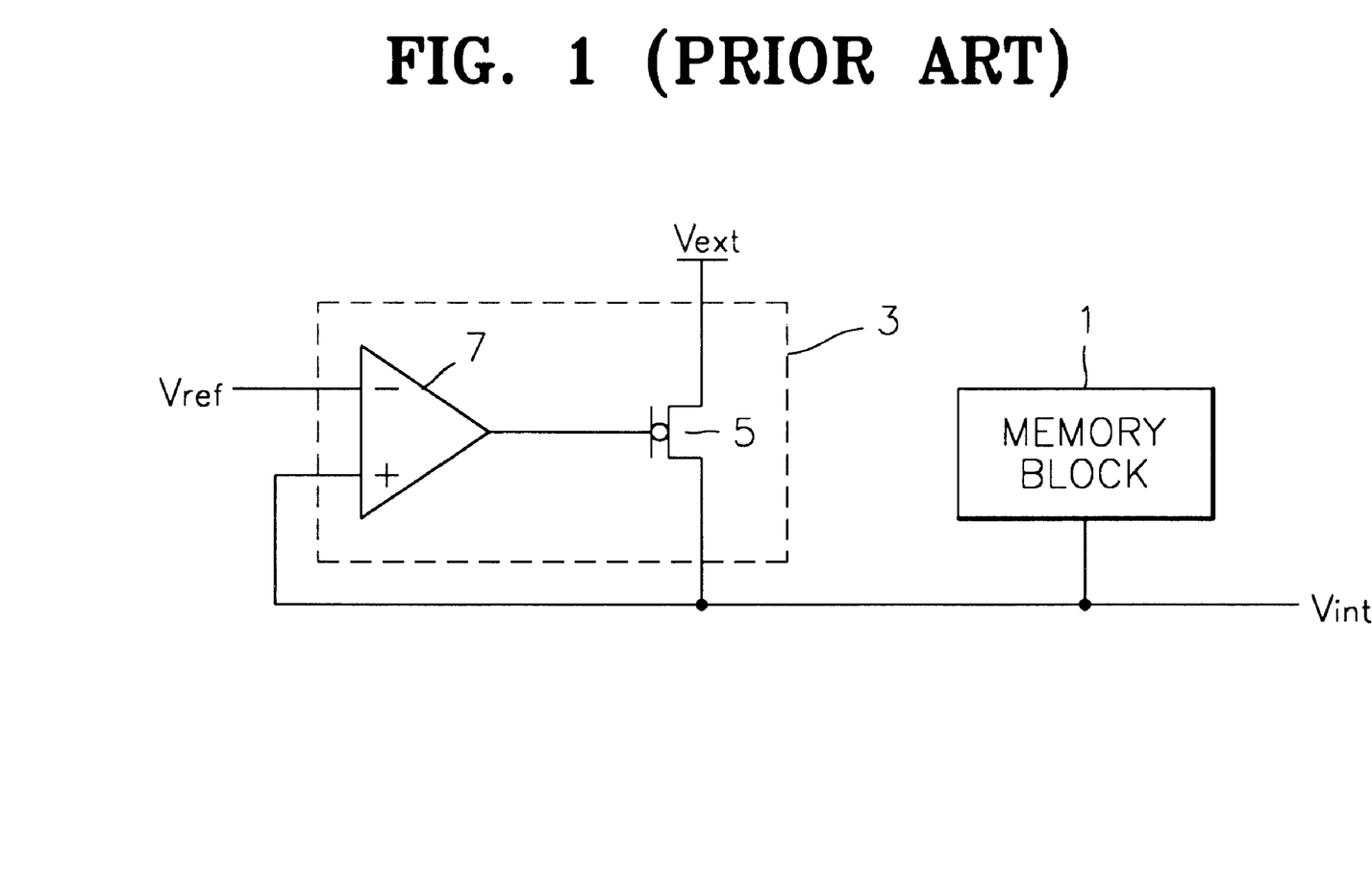
FIG. 1 is a schematic diagram of a memory device incorporating a conventional voltage down converter.

FIG. 1 is a schematic block diagram of a memory device incorporating a conventional voltage down converter 3. The conventional voltage down converter 3 includes a PMOS transistor 5 that receives an external supply voltage Vext at a first terminal, and produces a regulated voltage Vint responsive to a control signal generated by a comparator 7 that compares the regulated voltage Vint with a reference voltage Vref.

The regulated voltage Vint generated by the voltage down converter 3 is typically supplied to various circuits of the memory device, including circuits that exhibit current demand that varies responsive to control signals thereto. A write driver circuit, for example, may exhibit increased current demand responsive to a transition write enable signal. This increased demand may momentarily reduce the regulated voltage Vint. However, the reduction in the regulated voltage Vint is fed back to the comparator 7, which responsively lowers the gate voltage applied to the PMOS transistor 5 and drives the regulated voltage Vint up to the reference voltage Vref. Similarly, if the regulated supply voltage Vint goes higher than the reference voltage Vref, the output voltage of the comparator 7 increases and the gate voltage of the PMOS transistor 5 is increased to drive the regulated voltage Vint down to the reference voltage Vref.

However, the down converter 3 typically exhibits a delay in response to fluctuations of the regulated voltage Vint, due to parasitic resistance and parasitic capacitance. This delay can result in significant excursions in the regulated voltage Vint, particularly when a lot of data is read out or written during a high speed memory operation, when multiple write drivers operate simultaneously. If a write operation occurs before the regulated voltage Vint returns to its desired level, the operation of the memory device may be degraded.

SUMMARY OF THE INVENTION

In light of the foregoing, it is an object of the present invention to provide power supply circuits and methods which can compensate for instantaneous current demand associated with such circuits as memory write driver circuits.

This and other objects, features and advantages are provided by power supply circuits and methods in which a voltage regulator circuit that generates a regulated output voltage from a power supply voltage and applies the regulated voltage to a load circuit (e.g., a memory write driver circuit) when a load control signal (e.g., a write enable signal) applied to the load circuit is in a first state, is bypassed responsive to the load control signal transitioning from the first state to a second state, thus compensating for an increased current demand from the load circuit. Preferably, the voltage regulator circuit is bypassed a predetermined time following the state transition of the load control signal.

In particular, according to the present invention, a circuit for controlling voltage supplied to a load circuit that exhibits a current demand responsive to a load control signal applied thereto includes a power supply input terminal configured to receive a supply voltage and an output terminal configured to connect to the load circuit. A voltage regulator circuit is connected between the power supply input terminal and the output terminal and operative to regulate a voltage at the output terminal. A bypass circuit is operative to couple the power supply input terminal to the output terminal responsive to the load control signal and thereby bypass the voltage regulator circuit. The bypass circuit preferably includes a bypass control circuit configured to receive the load control signal and operative to generate a bypass control signal responsive to the load control signal, and a switching circuit, e.g., a transistor, operative to couple and decouple the power supply input terminal and the output terminal responsive to the bypass control signal.

According to an embodiment of the present invention, the bypass control circuit is operative to generate a bypass control signal having one of a first state and a second state. The switching circuit is responsive to the bypass control signal such that the voltage regulator circuit regulates an output voltage at the output terminal when the bypass control signal is in the first state and such that the power supply input terminal is coupled to the output terminal, bypassing the voltage regulator circuit, when the bypass control signal is in the second state. The load may exhibit increased current demand responsive to a state transition of the load control signal, and the bypass control circuit may be operative to momentarily drive the bypass control signal to the second state a predetermined time after the state transition of the load control signal.

According to another embodiment of the present invention, the bypass control circuit includes a pulse generating circuit configured to receive the load control signal and operative to produce a pulse of the second state in the bypass control signal responsive to a state transition of the load control signal. The load control signal may be synchronous to a clock signal, and the bypass control circuit may be configured to receive the clock signal and operative to momentarily drive the bypass control signal to the second state if the clock signal has a frequency in a predetermined range.

In another embodiment, the bypass control circuit includes a pulse generating circuit configured to receive the load control signal and operative to produce a pulse signal responsive to a state transition of the load control signal. A clock signal detector circuit is configured to receive the clock signal and operative to produce a clock signal detect signal responsive to the clock signal. An OR circuit is connected to the pulse generating circuit and to the clock signal detector circuit, configured to receive the pulse signal and the clock signal detect signal and operative to produce the bypass control signal therefrom.

In yet another embodiment according to the present invention, the bypass control circuit includes a first delay circuit configured to receive the load control signal and operative to responsively produce a first delayed version of the load control signal. A second delay circuit is connected to the first delay circuit, configured to receive the first delayed version of the load control signal and operative to responsively produce a second delayed version of the load control signal. A clock signal detector circuit is configured to receive the clock signal and operative to produce a clock signal detect signal responsive to the clock signal. A NAND circuit is connected to the first delay circuit, to the second delay circuit and to the clock signal detect circuit. The NAND circuit is configured to receive the first delayed version of the load control signal, the second delayed version of the load control signal and the clock signal detect signal, and operative to produce the bypass control signal therefrom.

According to another embodiment, the voltage regulator circuit includes a comparator circuit connected to the output terminal and operative to produce a comparator output signal responsive to a comparison of a reference voltage and an output voltage at the output terminal. A switching circuit, e.g., a transistor, is connected between the power supply input terminal and the output terminal. The switching circuit is configured to receive the comparator output signal and operative to couple and decouple the voltage source and the voltage regulator output terminal responsive to the comparator output signal.

A memory device according to another embodiment of the present invention includes a memory circuit that exhibits a current demand responsive to a memory control signal applied thereto. A power control circuit is configured to receive a power supply voltage and operative to supply a voltage therefrom to the memory circuit. The power control circuit includes a power supply input terminal configured to receive a supply voltage and an output terminal configured to connect to the memory circuit. A voltage regulator circuit is connected between the power supply input terminal and the output terminal and operative to regulate a voltage at the output terminal. A bypass circuit is operative to couple the power supply input terminal to the output terminal responsive to the memory control signal and thereby bypass the voltage regulator circuit. Related methods are also discussed.

DETAILED DESCRIPTION OF EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Those skilled in the art will appreciate that the present invention includes complementary implementations of the circuits described herein, and the present invention may be embodied as both apparatus (e.g., devices and circuits) and methods.

Figure 2:
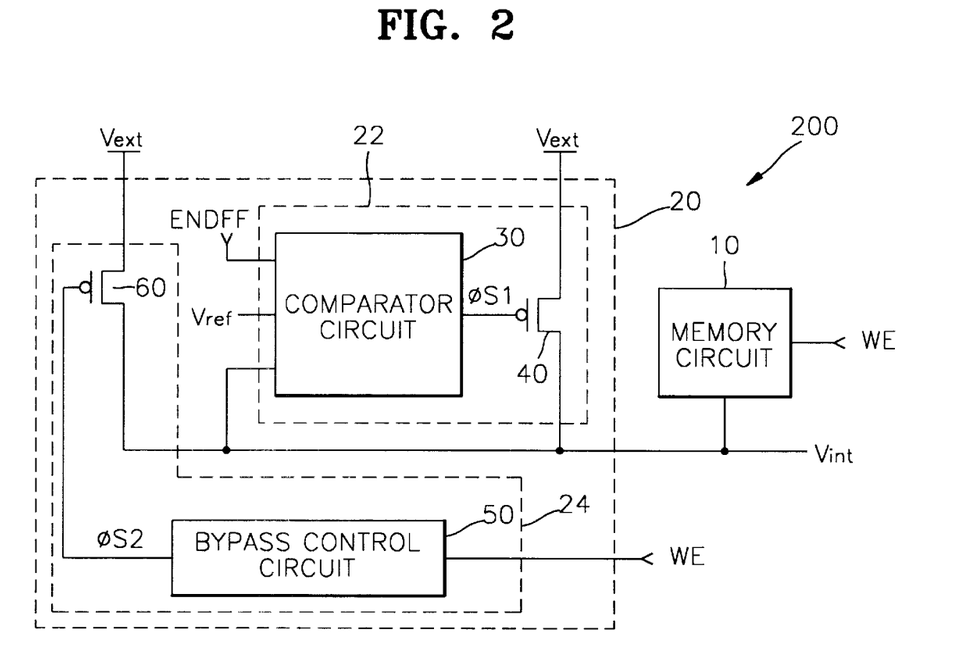
FIG. 2 is a schematic diagram of a memory device incorporating a power supply circuit according to an embodiment of the present invention.

FIG. 2 is a schematic block diagram of a memory device 200 incorporating a power control circuit 20 according to an embodiment of the present invention. For purposes of the following discussion, apparatus and methods of the present invention are described in relation to supplying power to memory circuit 10 of the memory device 200, which exhibits a current demand that is responsive to a control signal, e.g., a write enable signal WE applied to the memory circuit 10. Those skilled in the art will appreciate that the memory circuit 10 may include a variety of components including, for example, peripheral circuits such as data input/output circuits and a memory array including sense amplifier and writer driver circuits. However, those skilled in the art will appreciate that the present invention is also applicable for controlling the supply of power to any of a number of other types of load circuits than the memory circuit 10 illustrated in FIG. 2.

The power control circuit 20 includes a voltage regulator circuit 22 that is operative to regulate an output voltage Vint at an output terminal of the power control circuit 20. The power control circuit 20 also includes a bypass circuit 24 that is operative to bypass the voltage regulator circuit 22 responsive to the write enable signal WE, directly connecting the output terminal of the power control circuit to a power supply input terminal at which a power supply voltage Vext is applied through a switching transistor 60.

The voltage regulator circuit 22 includes a comparator circuit 30 that compares an output voltage Vint produced by the power control circuit 20 to a reference voltage Vref, and generates a first control signal $\phi S1$ that is applied to a control terminal (gate) of a switching transistor 40, e.g., a PMOS transistor. The comparator circuit 30 generates the first control signal $\phi S1$ responsive to a difference between the output voltage Vint and the reference voltage Vref. When the output voltage Vint is lower than the reference voltage Vref, the first control signal $\phi S1$ takes on a first state (as illustrated, a "low") that turns on the switching transistor 40, reducing the impedance between the output terminal of the power control circuit 20 and a power supply input terminal at which a power supply voltage Vext is applied. When the output voltage Vint is higher than the reference voltage Vref, the first control signal $\phi S1$ takes on a second state (as illustrated, a "high" state), turning off the switching transistor 40 and increasing the impedance between the output terminal and the power supply input terminal of the power control circuit 20. The comparator circuit 30 is activated by an enable signal ENDFF.

The bypass circuit 24 includes a bypass control circuit 50 that generates a bypass control signal $\phi S2$ responsive to the write enable signal WE, providing feedforward control of the output voltage Vint. As a state transition of the write enable signal WE typically presages a step increase in current demand by the memory circuit 10, the bypass control circuit 50 preferably generates a momentary pulse in the bypass control signal φS2 during a predetermined interval before the voltage regulator circuit 22 reacts to a drop in the output voltage Vint, providing a momentary boost to the output voltage Vint. In some embodiments, e.g., in synchronous memory devices in which the memory cycles of memory circuits such as the memory circuit 10 are synchronized to a clock signal, the second control signal φS2 may also be constrained to boost the output voltage Vint only if the voltage regulator circuit 22 will be unable to restore the output voltage Vint to a desired value before a succeeding clock (e.g., memory) cycle commences.

Figure 3:
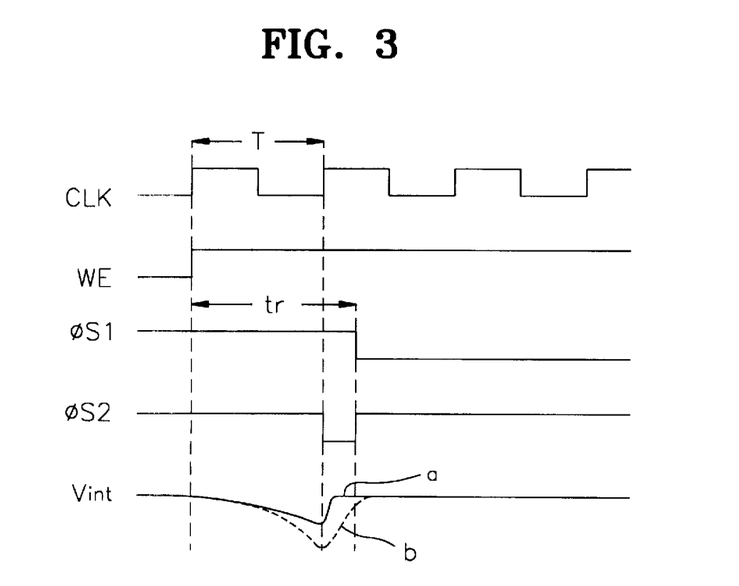
FIG. 3 illustrates exemplary operations for the power supply circuit of FIG. 2.

FIG. 3 illustrates exemplary waveforms for the power control circuit 20 of FIG. 2. If a response time tr, i.e., the time delay between a low-to-high transition of the write enable signal WE and responsive activation of the control signal φS1 by the voltage regulator circuit 22, is greater than the clock period T of the memory clock signal CLK, a pulse is generated in the bypass control signal φS2, causing the output voltage Vint to be momentarily boosted (waveform a) in comparison to the response that would occur without the boost (waveform b). Accordingly, the lowest excursion of the output voltage Vint is limited and the output voltage Vint recovers more quickly in preparation for the succeeding memory cycle.

Several variations of the bypass control circuit 50 will be described with reference to subsequent FIGS. 4 through 11.

Figure 4:
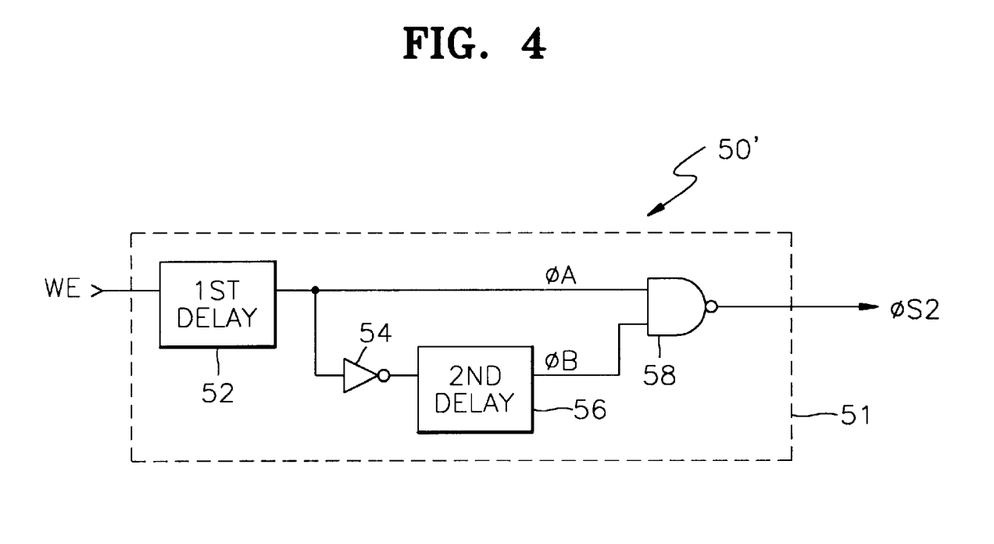
FIG. 4 is a schematic diagram of a bypass control circuit according to an embodiment of the present invention.

Referring to FIG. 4, a bypass control circuit 50' according to a first embodiment of the present invention includes a pulse generating circuit 51 that receives the write enable signal WE. The bypass control circuit 50' generates a pulse in the bypass control signal φS2 responsive to a state transition in the write enable signal WE. The pulse generating circuit 51 includes a first delay circuit 52 that receives the write enable signal WE and produces a delayed version φA therefrom. The delayed signal φA is passed to a series combination of an inverter 54 and a second delay circuit 56, which produces a inverted and delayed version φB of the write enable signal WE. The delayed signals φA, φB are passed to a NAND gate 58 that produces the bypass control signal φS2 therefrom.

Figure 5:
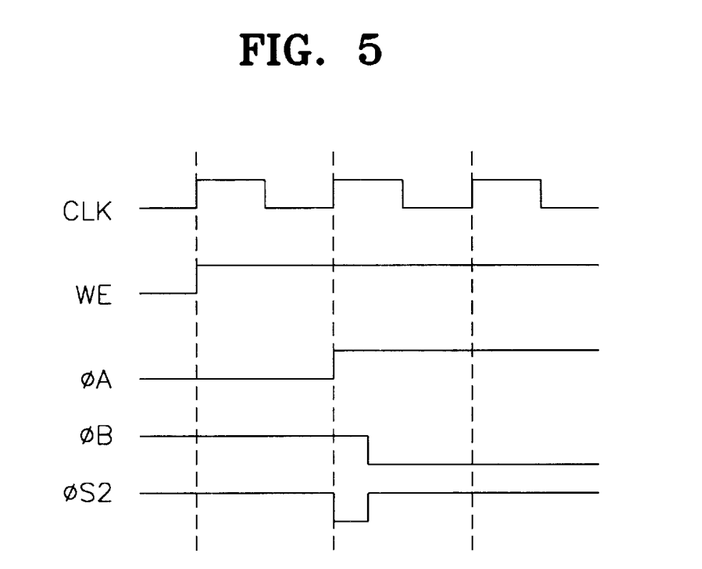
FIG. 5 illustrates exemplary operations for the bypass control circuit of FIG. 4.

In synchronous systems operating in sync with a clock signal such as the clock signal CLK of FIG. 5, the first delay circuit 52 preferably introduces a delay approximately equal to one cycle of the clock signal CLK, and the second delay circuit 56 introduces an additional delay such that the bypass control signal φS2 is pulsed for a time sufficient to "bridge" the transient response of the voltage regulator circuit 22. As shown in FIG. 5, the delayed signal φA corresponds to the write enable signal WE delayed for one cycle of the clock signal CLK. The delayed signal φB corresponds to the delayed signal φA, inverted and delayed by a predetermined additional delay. The bypass control signal φS2 output from the NAND gate 58 exhibits a logic low pulse during a period in which the delayed signals φA, φB are both at a logic high level.

When the write enable signal WE transitions from low to high, the memory circuit 10 performs a write operation, causing increased current demand that pulls down the output voltage Vint. The pulse in the second control signal φS2 is generated when this write operation is completed, that is, at the beginning of next cycle of the clock signal CLK. This momentarily boosts the output voltage Vint until the voltage regulator circuit 22 has had time to react to the drop in the output voltage Vint and turn on the switching transistor 40. Thus, even if a new write operation is started before the first switching element 40 operates, the output voltage Vint will be near its nominal value, reducing the likelihood of a malfunction during the new write operation.

Figure 6:
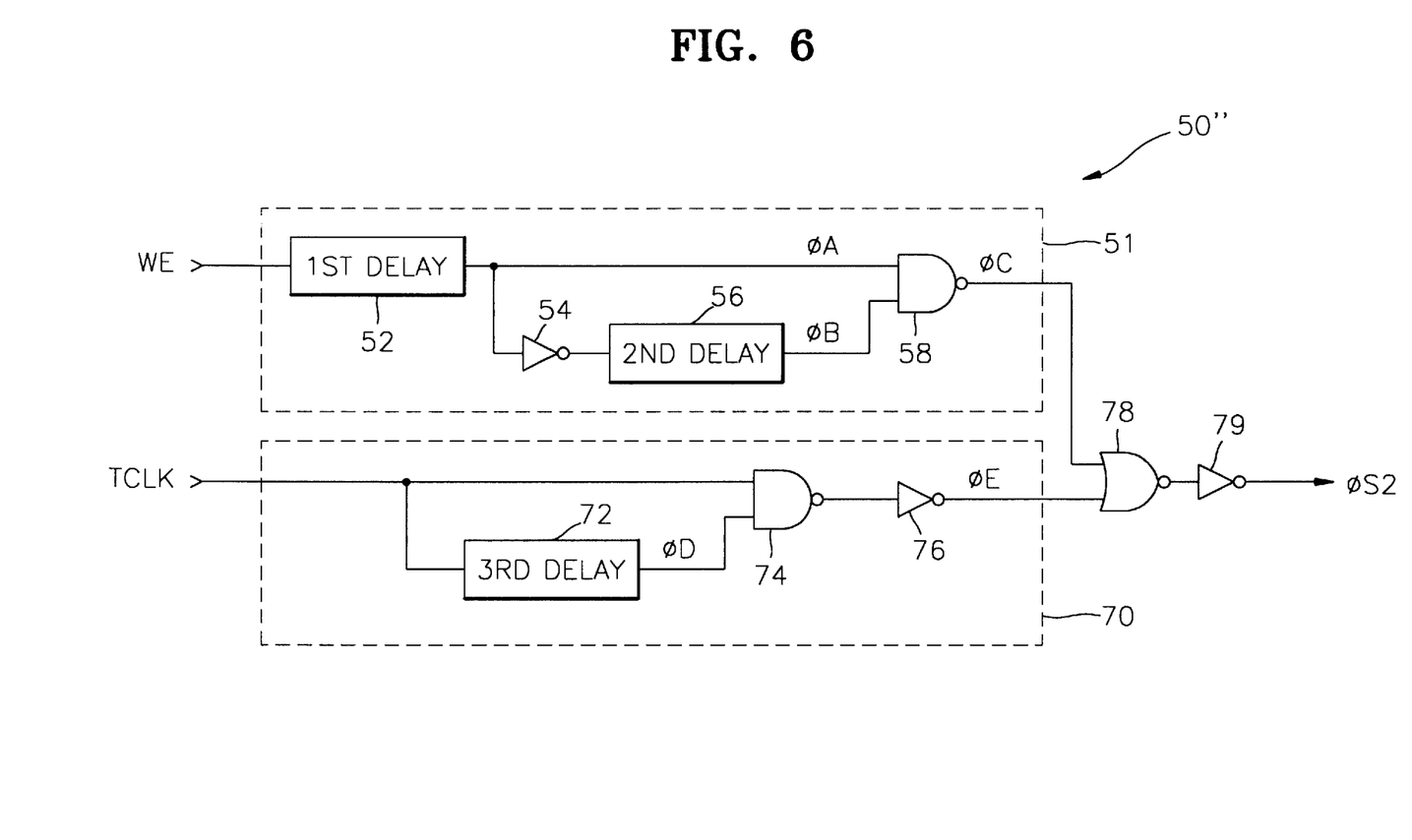
FIG. 6 is a schematic diagram of a bypass control circuit according to another embodiment of the present invention.
Figure 7A:
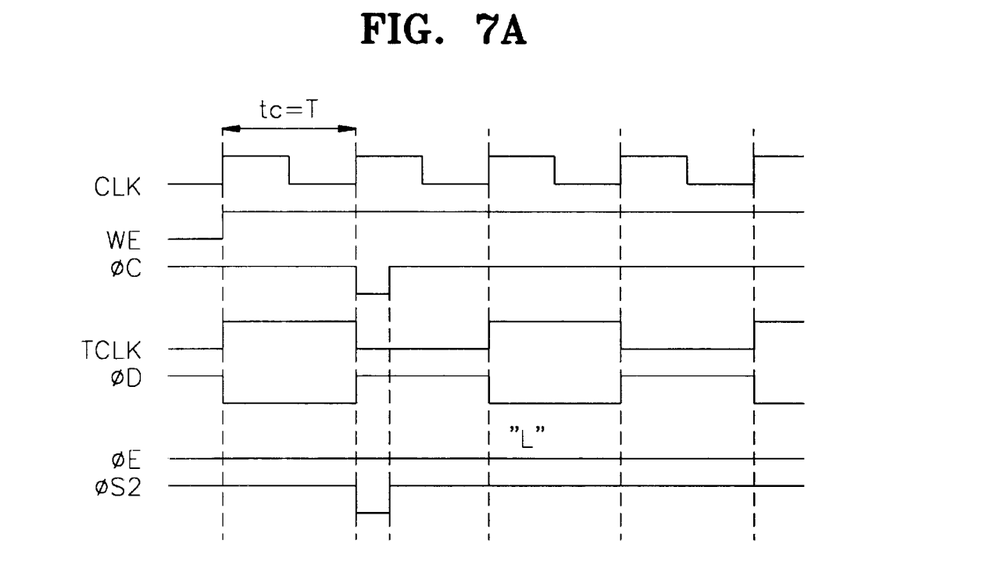
FIGS. 7A and 7B illustrate exemplary operations for the bypass control circuit of FIG. 6.
Figure 7B:
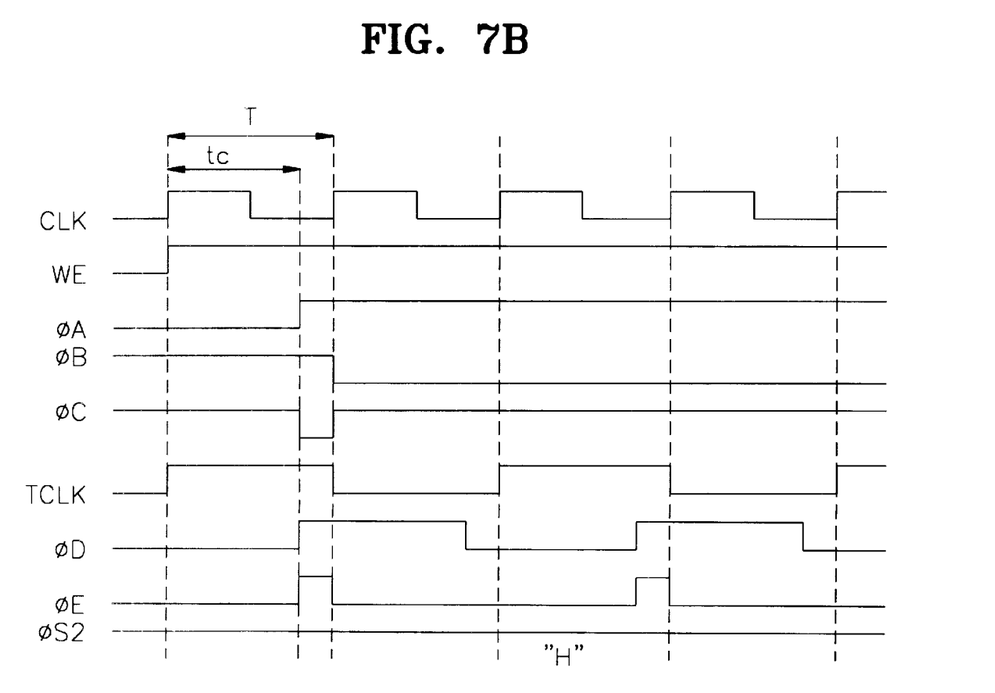

FIG. 6 illustrates a bypass control circuit 50" according to a second embodiment of the present invention, and FIGS. 7A and 7B are waveform diagrams illustrating exemplary operations thereof. The bypass control circuit 50" of FIG. 6 is similar to the bypass control circuit 50' of FIG. 4, with like elements labeled with like reference numerals. However, the bypass control circuit 50" also includes a clock signal detection circuit 70 that generates a pulse in an output signal φE responsive to a state transition of a transitional clock signal TCLK having a frequency ½ that of the memory clock signal CLK, specifically, to a falling edge of the transitional clock signal TCLK. The clock signal detection circuit 70 includes a third delay circuit 72 for producing a delayed clock signal φD corresponding to the transitional clock signal delayed by a delay tc, and a combination of a NAND gate 74 and inverter 79 that receives the delayed clock signal φD and the transitional clock signal TCLK and produces an output signal φE. Output signals φC, φE produced by the pulse generating circuit 51 and the clock signal detection circuit 70, respectively, are applied to a NOR gate 78, the output of which is inverted by an inverter 79 to produce the bypass control signal φS2. If both of the signals φC, φE are low, the bypass control signal φS2 goes low.

As illustrated in FIGS. 7A and 7B, the delay circuit 52 of the pulse generating circuit 51 and the delay circuit 72 of the clock signal detection circuit 70 each introduce a delay tc. When the delay tc is less than the period T of the memory clock signal CLK, as shown in FIG. 7B, the clock signal detection circuit 70 generates a high pulse in the output signal φE immediately preceding the falling edge of the transitional clock signal TCLK. This positive pulse in the output signal φE coincides with a negative pulse of the output signal φC produced by the pulse generating circuit 51, thus causing the bypass control signal φS2 to remain high, leaving the switching transistor 60 of FIG. 2 in a non-conducting state. However, as illustrated in FIG. 7A, when the period T of the memory clock signal CLK is less than or equal to the delay tc, the output signal φE produced by the clock signal detection circuit 70 is low when the output signal φC produced by the pulse generating circuit 51 is pulsed low, causing a low pulse in the bypass control signal φS2. The low pulse in the bypass control signal φS2 momentarily turns on the switching transistor 60 and provides a momentary boost to the output voltage Vint, as described above. Those skilled in the art will appreciate that FIG. 7A illustrates a case in which the period T of the memory clock signal CLK is equal to the delay tc; it will be appreciated that when the period T is less than the delay tc and greater than ½ the delay tc, a positive pulse is generated in the output signal φE produced by the clock signal detection circuit 70, but this positive pulse does not coincide with the negative pulse of the output signal φC produced by the pulse generating circuit 51. Thus, the bypass control circuit 50" acts to boost the output voltage Vint when the period T of the memory clock signal CLK is less than the delay tc and greater than ½ the delay tc, i.e., when the frequency of the memory clock signal is in a predetermined range.

Figure 8:
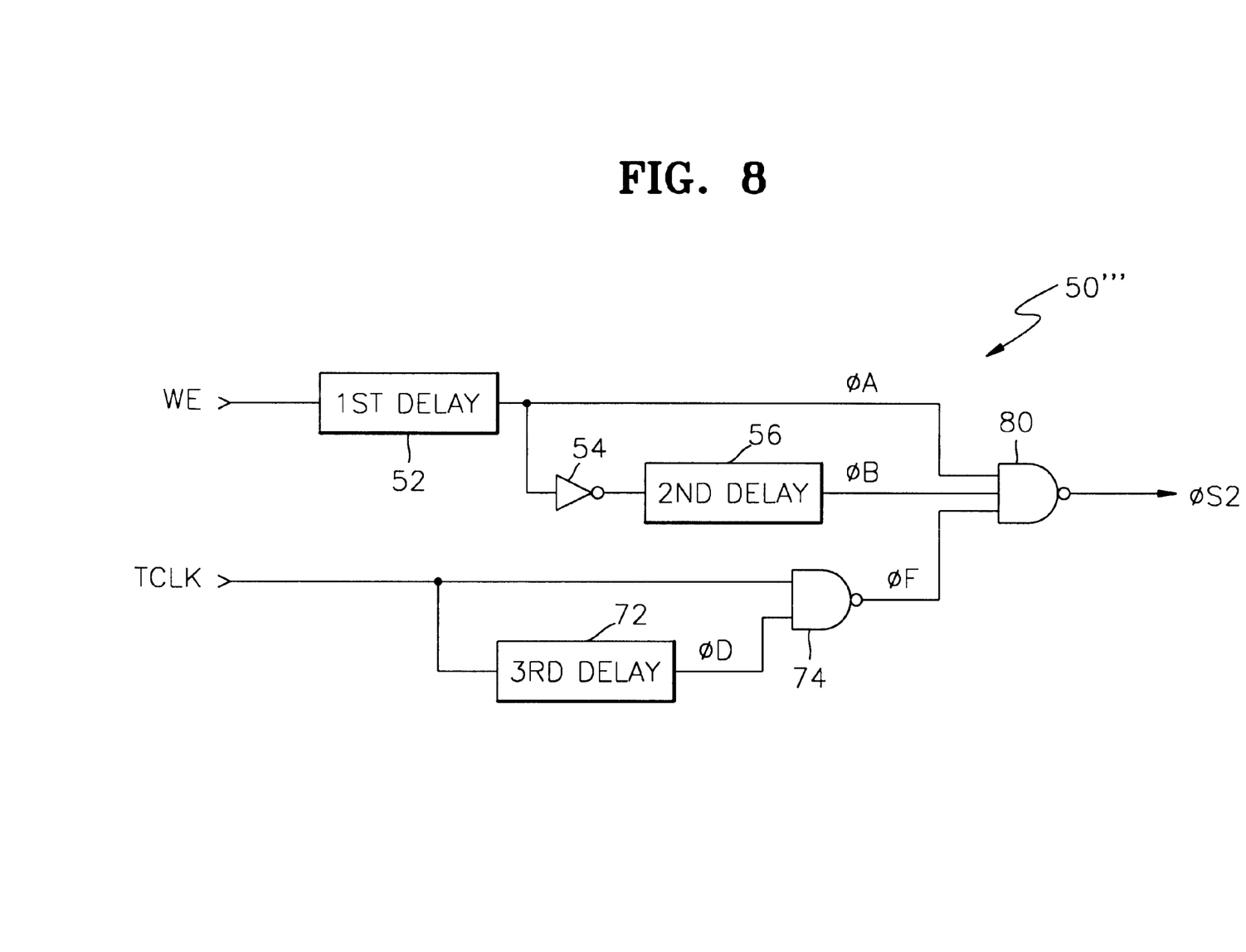
FIG. 8 is a schematic diagram of a bypass control circuit according to another embodiment of the present invention.
Figure 9A:
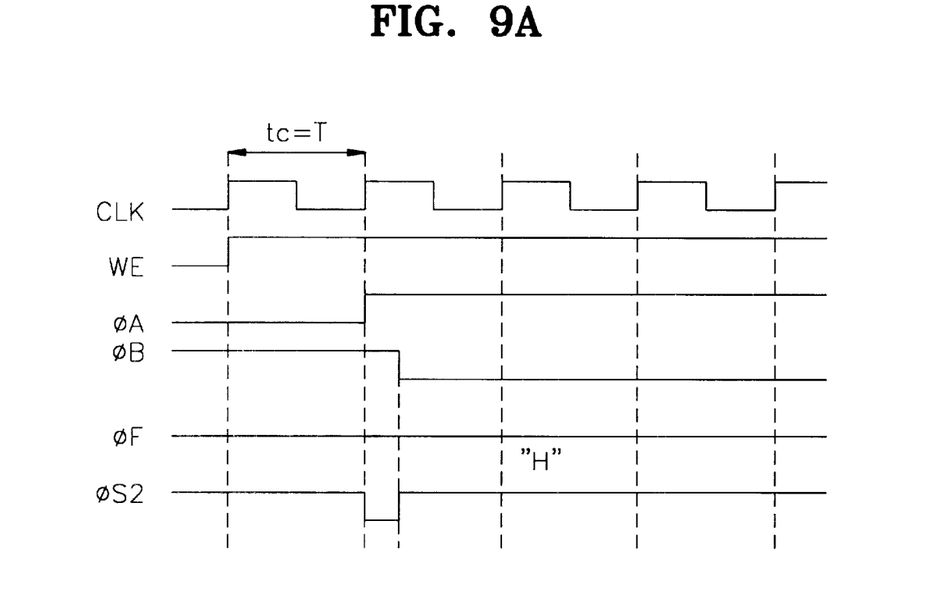
FIGS. 9A and 9B illustrate exemplary operations of the bypass control circuit of FIG. 8.
Figure 9B:
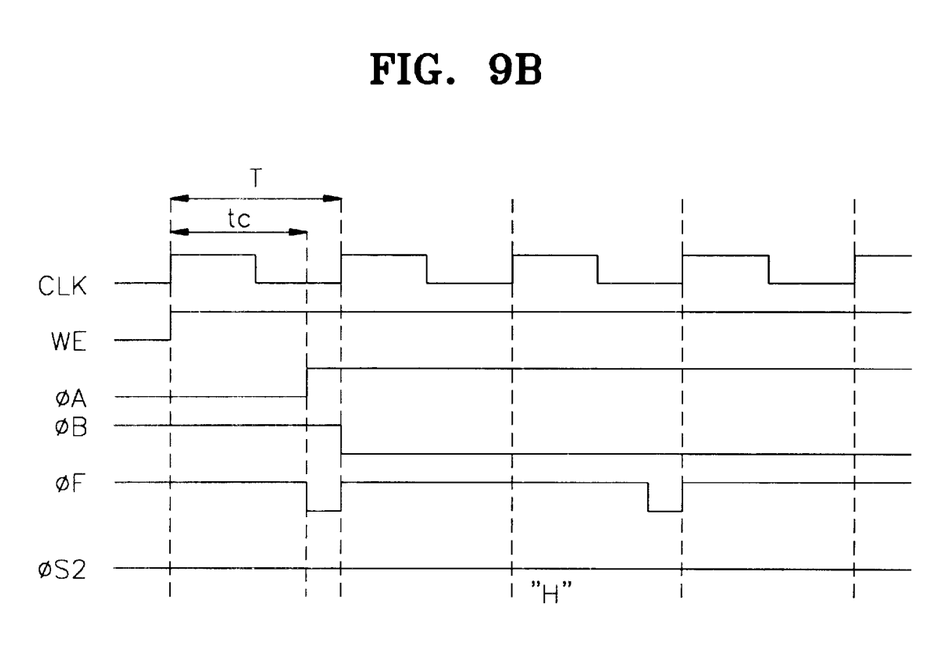

FIG. 8 illustrates a bypass control circuit 50'" according to a third embodiment of the present invention, and FIGS. 9A and 9B are waveform diagrams illustrating exemplary operations of the bypass control circuit 50'". The bypass control circuit 50'" of FIG. 8 is similar to the bypass control circuit 50" of FIG. 6, with like elements denoted by like reference numerals. In the bypass control circuit 50''', however, the functions of the NAND gate 58, the inverter 76, the NOR gate 78 and the inverter 79 of FIG. 6 are supplanted by a three-input NAND gate 80. The 3-input NAND gate 80 receives the output signal φA of the first delay circuit 52, the output signal φB of the second delay circuit 56, and the output signal φF of the NAND gate 74, producing a low level in the bypass control signal φS2 when the signals φA, φB, φF are all at a logic high level.

As shown in FIG. 9A, when the memory device operates at a higher speed, that is to say, when the period T of the memory clock signal CLK is less than or equal to the delay tc introduced by the first and third delay circuits 52, 72, the output signal φF of the NAND gate 74 is at a logic high level when the signals φA, φB are also at a logic high level, thus producing a low pulse in the bypass control signal φS2 after the delay tc. When the period T of the clock signal CLK is longer than the delay tc, the output signal φF of the NAND gate 74 is pulsed low during the period when the output signals φA, φB are both high, preventing generation of a low pulse in the bypass control signal φS2. Similar to the bypass control circuit 50" of FIG. 6, the bypass control circuit 50''' of FIG. 8 acts to boost the output voltage Vint produced by the power control circuit 20 of FIG. 2 when the period T of the memory clock signal CLK is less than the delay tc and greater than ½ the delay tc, i.e., when the frequency of the memory clock signal CLK is in a predetermined range.

According to embodiments of FIGS. 6 and 8, when the memory device operates at a frequency exceeding a predetermined level, the bypass control signal φS2 turns on the switching transistor 60 of FIG. 2, providing a momentary boost to the output voltage Vint produced by the power control circuit 20. When the memory device operates at lower frequencies, however, the bypass control signal φS2 is not asserted, and no boost is provided, thereby potentially reducing unnecessary power consumption. The embodiment of FIG. 8 may be more advantageous in comparison to the embodiment illustrated in FIG. 6, as the number of used logic gates is reduced, allowing the power control circuit 20 to occupy a smaller area.

Figure 10:
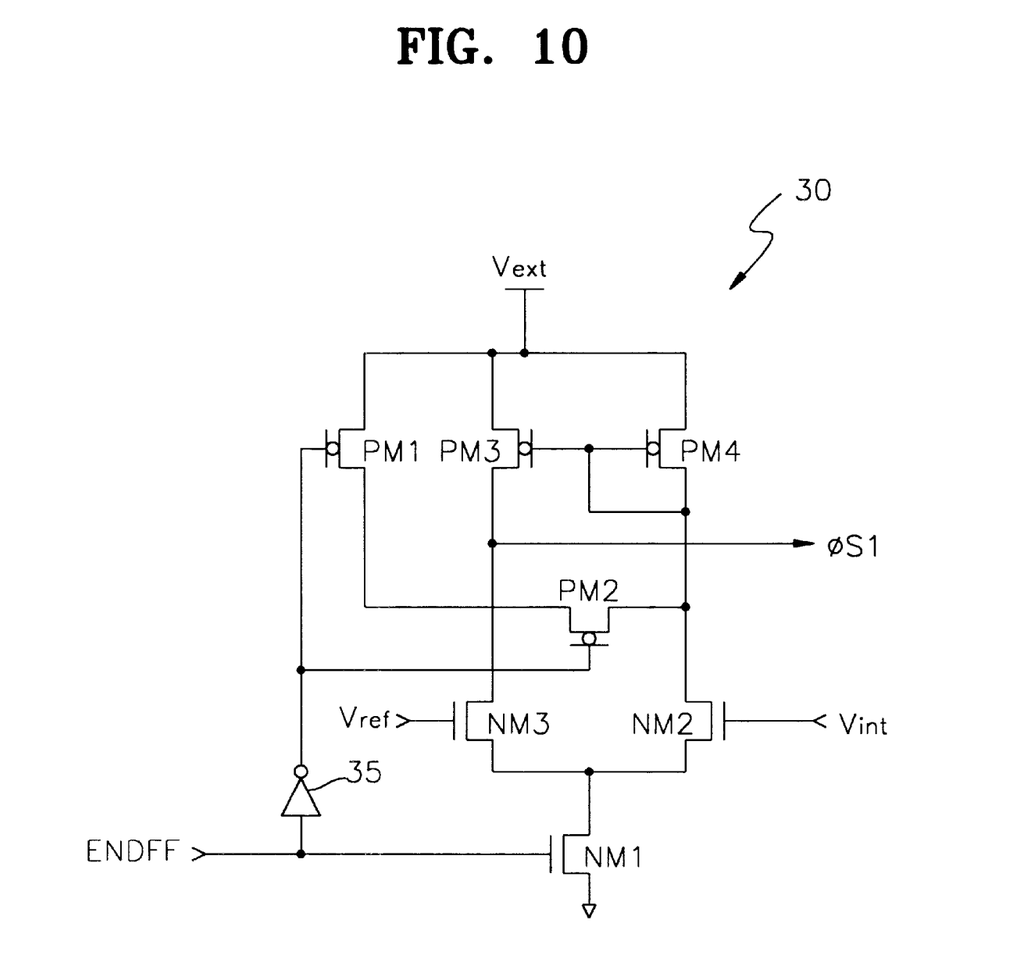
FIG. 10 is a schematic diagram of a voltage regulator circuit according to an embodiment of the present invention.

FIG. 10 illustrates an exemplary embodiment of the comparator circuit 30 of FIG. 2. The comparator circuit 30 includes a differential amplifier for differentially amplifying the output voltage Vint and the reference voltage Vref. If the switching transistor 40 is a PMOS transistor as illustrated in FIG. 2, the comparator circuit 30 preferably is configured such that it produces an output signal φS1 that has a logic high value when the output voltage Vint exceeds the reference voltage Vref, and a logic low value when the output Vint is less than the reference voltage Vref.

The operation of the comparator circuit 30 illustrated in FIG. 10 will now be described. If an enable signal ENDFF is at a logic high level, a first NMOS transistor NM1 and first and second PMOS transistors PM1, PM2 are turned on through the action of an inverter 35. If, the output voltage Vint is higher than the reference voltage Vref, a second NMOS transistor NM2 turns on, turning on third and fourth PMOS transistors PM3, PM4 and producing a logic high level in the output control signal φS1. Conversely, if the output voltage Vint is lower than the reference voltage Vref, the third NMOS transistor NM3 is turned on, and a logic low level is produced in the control signal φS1.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A circuit for controlling voltage supplied to a load circuit that exhibits a current demand responsive to a load control signal applied thereto, the regulator comprising:
   a power supply input terminal configured to receive a supply voltage;
   an output terminal configured to connect to the load circuit;
   a voltage regulator circuit connected between said power supply input terminal and said output terminal and operative to regulate a voltage at said output terminal;
   a bypass control circuit configured to receive the load control signal and operative to generate a bypass control signal responsive to the load control signal and before said voltage regulator circuit reacts to regulate said output terminal voltage in response to said current demand; and
   a switching circuit operative to couple and decouple said power supply input terminal and said output terminal responsive to said bypass control signal.

2. A circuit according to claim 1, wherein said switching circuit comprises a transistor.

3. A circuit according to claim 1:
   wherein said bypass control circuit is operative to generate a bypass control signal having one of a first state and a second state; and
   wherein said switching circuit is responsive to said bypass control signal such that said voltage regulator circuit regulates an output voltage at said output terminal when said bypass control signal is in said first state and such that said power supply input terminal is coupled to said output terminal, bypassing said voltage regulator circuit, when said bypass control signal is in said second state.

4. A circuit according to claim 3, wherein the load exhibits increased current demand responsive to a state transition of the load control signal, and wherein said bypass control circuit is operative to momentarily drive said bypass control signal to said second state a predetermined time after the state transition of the load control signal.

5. A circuit for controlling voltage supplied to a load circuit that exhibits a current demand responsive to a load control signal applied thereto, the regulator comprising:
   a power supply input terminal configured to receive a supply voltage;
   an output terminal configured to connect to the load circuit;
   a voltage regulator circuit connected between said power supply input terminal and said output terminal and operative to regulate a voltage at said output terminal;
   a bypass circuit operative to couple said power supply input terminal to said output terminal responsive to said load control signal and thereby bypass said voltage regulator circuit, wherein said bypass circuit comprises:
      a bypass control circuit configured to receive the load control signal and operative to generate a bypass control signal responsive to the load control signal; and
      a switching circuit operative to couple and decouple said power supply input terminal and said output terminal responsive to said bypass control signal;

wherein said bypass control circuit is operative to generate a bypass control signal having one of a first state and a second state;

wherein said switching circuit is responsive to said bypass control signal such that said voltage regulator circuit regulates an output voltage at said output terminal when said bypass control signal is in said first state and such that said power supply input terminal is coupled to said output terminal, bypassing said voltage regulator circuit, when said bypass control signal is in said second state;

wherein the load exhibits increased current demand responsive to a state transition of the load control signal, and wherein said bypass control circuit is operative to momentarily drive said bypass control signal to said second state a predetermined time after the state transition of the load control signal; and wherein said bypass control circuit comprises a pulse generating circuit configured to receive the load control signal and operative to produce a pulse of said second state in said bypass control signal responsive to a state transition of the load control signal.

6. A circuit for controlling voltage supplied to a load circuit that exhibits a current demand responsive to a load control signal applied thereto, the regulator comprising:

a power supply input terminal configured to receive a supply voltage;

an output terminal configured to connect to the load circuit;

a voltage regulator circuit connected between said power supply input terminal and said output terminal and operative to regulate a voltage at said output terminal;

a bypass circuit operative to couple said power supply input terminal to said output terminal responsive to said load control signal and thereby bypass said voltage regulator circuit, wherein said bypass circuit comprises:

a bypass control circuit configured to receive the load control signal and operative to generate a bypass control signal responsive to the load control signal; and a switching circuit operative to couple and decouple said power supply input terminal and said output terminal responsive to said bypass control signal;

wherein said bypass control circuit is operative to generate a bypass control signal having one of a first state and a second state;

wherein said switching circuit is responsive to said bypass control signal such that said voltage regulator circuit regulates an output voltage at said output terminal when said bypass control signal is in said first state and such that said power supply input terminal is coupled to said output terminal by passing said voltage regulator circuit, when said bypass control signal is in said second state;

wherein the load exhibits increased current demand responsive to a state transition of the load control signal, and wherein said bypass control circuit is operative to momentarily drive said bypass control signal to said second state a predetermined time after the state transition of the load control signal; and wherein the load control signal is synchronous to a clock signal, and wherein said bypass control circuit is configured to receive the clock signal and operative to momentarily drive said bypass control signal to said second state if the clock signal has a frequency in a predetermined range.

7. A circuit according to claim 6, wherein said bypass control circuit comprises:

a pulse generating circuit configured to receive the load control signal and operative to produce a pulse signal responsive to a state transition of the load control signal;

a clock signal detector circuit configured to receive the clock signal and operative to produce a clock signal detect signal responsive to the clock signal; and an OR circuit connected to said pulse generating circuit and to said clock signal detector circuit, configured to receive said pulse signal and said clock signal detect signal and operative to produce said bypass control signal therefrom.

8. A circuit according to claim 6, wherein said bypass control circuit comprises:

a first delay circuit configured to receive the load control signal and operative to responsively produce a first delayed version of the load control signal;

a second delay circuit connected to said first delay circuit, configured to receive the first delayed version of the load control signal and operative to responsively produce a second delayed version of the load control signal;

a clock signal detector circuit configured to receive the clock signal and operative to produce a clock signal detect signal responsive to the clock signal; and a NAND circuit connected to said first delay circuit, to said second delay circuit and to clock signal detect circuit, configured to receive said first delayed version of the load control signal, said second delayed version of the load control signal and said clock signal detect signal, and operative to produce said bypass control signal therefrom.

9. A circuit according to claim 1, wherein said voltage regulator circuit comprises:

a comparator circuit connected to said output terminal and operative to produce a comparator output signal responsive to a comparison of a reference voltage and an output voltage at said output terminal; and a switching circuit connected between said power supply input terminal and said output terminal and configured to receive said comparator output signal, said switching circuit operative to couple and decouple the voltage source and the voltage regulator output terminal responsive to said comparator output signal.

10. A circuit according to claim 9, wherein said switching circuit comprises a transistor.

11. A memory device comprising:

a memory circuit that exhibits a current demand responsive to a memory control signal applied thereto;

a power control circuit configured to receive a power supply voltage and operative to supply a voltage therefrom to said memory circuit, said power control circuit comprising:

a power supply input terminal configured to receive a supply voltage;

an output terminal configured to connect to the memory circuit;

a voltage regulator circuit connected between said power supply input terminal and said output terminal and operative to regulate a voltage at said output terminal;

a bypass circuit operative to couple said power supply input terminal to said output terminal responsive to said memory control signal and thereby bypass said voltage regulator circuit, the bypass circuit comprising:

a bypass control circuit configured to receive the memory control signal and operative to generate a bypass control signal responsive to the memory control signal and before said voltage regulator circuit reacts to regulate said output terminal voltage in response to said current demand; and a switching circuit operative to couple and decouple said power supply input terminal and said output terminal responsive to said bypass control signal.

12. A device according to claim 11:

wherein said bypass control circuit is operative to generate a bypass control signal having one of a first state and a second state; and wherein said switching circuit is responsive to said bypass control signal such that said voltage regulator circuit regulates an output voltage at said output terminal when said bypass control signal is in said first state and such that said power supply input terminal is coupled to said output terminal, bypassing said voltage regulator circuit, when said bypass control signal is in said second state.

13. A device according to claim 12, wherein said memory circuit exhibits increased current demand responsive to a state transition of the memory control signal, and wherein said bypass control circuit is operative to momentarily drive said bypass control signal to said second state a predetermined time after the state transition of the memory control signal.

14. A memory device comprising:

a memory circuit that exhibits a current demand responsive to a memory control signal applied thereto;

a power control circuit configured to receive a power supply voltage and operative to supply a voltage therefrom to said memory circuit, said power control circuit comprising:

a power supply input terminal configured to receive a supply voltage;

an output terminal configured to connect to the memory circuit;

a voltage regulator circuit connected between said power supply input terminal and said output terminal and operative to regulate a voltage at said output terminal; and a bypass circuit operative to couple said power supply input terminal to said output terminal responsive to said memory control signal and thereby bypass said voltage regulator circuit, wherein said bypass circuit comprises:

a bypass control circuit configured to receive the memory control signal and operative to generate a bypass control signal responsive to the memory control signal; and a switching circuit operative to couple and decouple said power supply input terminal and said output terminal responsive to said bypass control signal;

wherein said bypass control circuit is operative to generate a bypass control signal having one of a first state and a second state; and wherein said switching circuit is responsive to said bypass control signal such that said voltage regulator circuit regulates an output voltage at said output terminal when said bypass control signal is in said first state and such that said power supply input terminal is coupled to said output terminal, bypassing said voltage regulator circuit, when said bypass control signal is in said second state;

wherein said memory circuit exhibits increased current demand responsive to a state transition of the memory control signal, and wherein said bypass control circuit is operative to momentarily drive said bypass control signal to said second state a predetermined time after the state transition of the memory control signal; and wherein the memory control signal is synchronous to a clock signal, and wherein said bypass control circuit is configured to receive the clock signal and operative to momentarily drive said bypass control signal to said second state if the clock signal has a frequency in a predetermined range.

15. A device according to claim 11, wherein said voltage regulator circuit comprises:

a comparator circuit connected to said output terminal and operative to produce a comparator output signal responsive to a comparison of a reference voltage and an output voltage at said output terminal; and a switching circuit connected between said power supply input terminal and said output terminal and configured to receive said comparator output signal, said switching circuit operative to couple and decouple the voltage source and the voltage regulator output terminal responsive to said comparator output signal.

16. A device according to claim 11:

wherein said memory circuit comprises a write driver circuit that exhibits a current demand responsive to a write enable signal applied thereto; and wherein said bypass circuit is operative to couple said power supply input terminal to said output terminal responsive to said write enable signal and thereby bypass said voltage regulator circuit.

17. A method of supplying power from power supply to a memory circuit that exhibits a current demand responsive to a memory control signal applied thereto, the method comprising the steps of:

applying a regulated voltage to memory circuit when the memory control signal is in a first state, the regulated voltage generated from a power supply voltage by a voltage regulator circuit connected between the power supply and the power supply input of the memory circuit; and directly coupling the power supply to the memory circuit to momentarily bypass the voltage regulator circuit responsive to a transition of the memory control signal from the first state to a second state and before said voltage regulator circuit reacts to regulate said power supply input in response to a current demand associated with the transition of the memory control signal.

18. A method according to claim 17, wherein said step of directly coupling comprises the step of directly coupling the power supply to the power supply input a predetermined time after the transition of the memory control signal from the first state to the second state.

* * * * *